US 10,257,942 B1

(12) United States Patent
Yoshida et al.

(10) Patent No.: US 10,257,942 B1
(45) Date of Patent: Apr. 9, 2019

(54) STACKABLE VARIABLE HEIGHT VIA PACKAGE AND METHOD

(71) Applicant: Amkor Technology, Inc., Chandler, AZ (US)

(72) Inventors: Akito Yoshida, Chandler, AZ (US); Mahmoud Dreiza, Phoenix, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 1088 days.

(21) Appl. No.: 13/896,710

(22) Filed: May 17, 2013

Related U.S. Application Data

(62) Division of application No. 12/537,048, filed on Aug. 6, 2009, now Pat. No. 8,471,154.

(51) Int. Cl.
H05K 3/42 (2006.01)

(52) U.S. Cl.
CPC .......... *H05K 3/42* (2013.01); *Y10T 29/49002* (2015.01)

(58) Field of Classification Search
CPC ...... H05K 3/42; H05K 3/4015; H05K 3/4038; H05K 3/403; Y10T 29/49002; Y10T 29/49117; Y10T 29/49124; Y10T 29/49155; Y10T 29/49165; Y10T 29/49169
USPC .............. 29/854, 825, 592.1, 829, 852, 846; 174/260, 262
See application file for complete search history.

(56) References Cited

U.S. PATENT DOCUMENTS

| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |

(Continued)

FOREIGN PATENT DOCUMENTS

| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993.

(Continued)

*Primary Examiner* — Peter DungBa Vo
*Assistant Examiner* — Azm Parvez
(74) *Attorney, Agent, or Firm* — McAndrews, Held & Malloy, Ltd.

(57) ABSTRACT

A stackable variable height via package includes a substrate having a first surface and terminals thereon. The terminals include a first terminal and a second terminal. Vias are on the terminals, the vias including a first via on the first terminal and a second via on the second terminal. The first via has a height from the first surface of the substrate less than a height of the second via from the first surface of the substrate. The package further includes a package body and via apertures in the package body to expose the vias. Forming the stackable variable height via package with variable height vias readily accommodate stacking of additional packages having different types of terminals, e.g., LGA and BGA type packages, as well as variable degrees of warpage on the stackable variable height via package. Further, the vias are formed with a minimum pitch.

20 Claims, 13 Drawing Sheets

(56) References Cited

U.S. PATENT DOCUMENTS

| | | |
|---|---|---|
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,025,648 A | 2/2000 | Takahashi et al. |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,443,351 B1* | 9/2002 | Huang ................ B23K 3/0623 228/103 |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,828,665 B2 | 12/2004 | Pu et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 6,987,314 B1* | 1/2006 | Yoshida ............ H01L 23/49816 257/692 |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,091,619 B2 | 8/2006 | Aoyagi |
| 7,125,744 B2 | 10/2006 | Takehara et al. |
| 7,185,426 B1 | 3/2007 | Hiner et al. |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |

(56) References Cited

U.S. PATENT DOCUMENTS

| | | | |
|---|---|---|---|
| 7,714,233 B2* | 5/2010 | Kawamura | H01L 21/4853 |
| | | | 174/260 |
| 7,714,452 B2* | 5/2010 | Clevenger | H01L 23/13 |
| | | | 257/738 |
| 7,777,351 B1 | 8/2010 | Berry et al. | |
| 7,825,520 B1 | 11/2010 | Longo et al. | |
| 7,960,827 B1 | 6/2011 | Miller, Jr. et al. | |
| 7,994,643 B2 | 8/2011 | Kwon et al. | |
| 8,222,538 B1* | 7/2012 | Yoshida | H01L 23/3128 |
| | | | 174/262 |
| 8,341,835 B1 | 1/2013 | Huemoeller et al. | |
| 2002/0017712 A1 | 2/2002 | Bessho et al. | |
| 2002/0061642 A1 | 5/2002 | Haji et al. | |
| 2002/0066952 A1 | 6/2002 | Taniguchi et al. | |
| 2002/0195697 A1 | 12/2002 | Mess et al. | |
| 2003/0025199 A1 | 2/2003 | Wu et al. | |
| 2003/0128096 A1 | 7/2003 | Mazzochette | |
| 2003/0141582 A1 | 7/2003 | Yang et al. | |
| 2003/0197284 A1 | 10/2003 | Khiang et al. | |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 | 6/2005 | Takahashi | |
| 2005/0242425 A1 | 11/2005 | Leal et al. | |
| 2007/0273049 A1 | 11/2007 | Khan et al. | |
| 2007/0281471 A1 | 12/2007 | Hurwitz et al. | |
| 2007/0290376 A1 | 12/2007 | Zhao et al. | |
| 2008/0230887 A1* | 9/2008 | Sun | H01L 21/565 |
| | | | 257/686 |
| 2010/0072600 A1* | 3/2010 | Gerber | H01L 21/561 |
| | | | 257/686 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58$^{th}$ *ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa," U.S. Appl. No. 10/992,371, filed Nov. 18, 2004.

Huemoeller et al., "Build Up Motherboard Fabrication Method and Structure," U.S. Appl. No. 11/824,395, filed Jun. 29, 2007.

Yoshida et al., "Stackable Variable Height Via Package and Method," U.S. Appl. No. 12/537,048, filed Aug. 6, 2009.

* cited by examiner

STACKABLE VARIABLE HEIGHT VIA PACKAGE AND METHOD

RELATED APPLICATIONS

This application is a divisional of Yoshida et al., U.S. patent application Ser. No. 12/537,048, filed on Aug. 6, 2009, entitled "STACKABLE VARIABLE HEIGHT VIA PACKAGE AND METHOD", which is herein incorporated by reference in its entirety.

BACKGROUND OF THE INVENTION

Field of the Invention

The present application relates to the field of electronics, and more particularly, to methods of forming electronic component packages and related structures.

Description of the Related Art

To form an electronic component package, an electronic component is mounted to a substrate. The substrate includes traces on the same surface of the substrate to which the electronic component is mounted. Bond wires are formed to electrically connect bond pads of the electronic component to the traces.

To protect the electronic component as well as the bond wires, the electronic component and bond wires are covered in an encapsulant. The traces extend from under the encapsulant to an exposed area of the surface of the substrate outside of the periphery of the encapsulant, i.e., not covered by the encapsulant. The traces include terminals on the exposed area of the substrate outside of and around the encapsulant.

Solder balls are formed on the terminals. These solder balls extend from the substrate to a height greater than the height of the encapsulant to allow the solder balls to be electrically connected to a larger substrate such as a printed circuit motherboard.

However, the solder balls are substantially spherical in shape. Thus, forming the solder balls with a height greater than the height of the encapsulant places fundamental restrictions on minimizing the pitch of the solder balls.

SUMMARY OF THE INVENTION

In accordance with one embodiment, a stackable variable height via package includes a substrate having a first surface and terminals thereon. The terminals include a first terminal and a second terminal. Vias are on the terminals, the vias including a first via on the first terminal and a second via on the second terminal. The first via has a height from the first surface of the substrate less than a height of the second via from the first surface of the substrate. The package further includes a package body and via apertures in the package body to expose the vias.

Forming the stackable variable height via package with variable height vias readily accommodate stacking of additional packages having different types of terminals, e.g., LGA and BGA type packages, as well as variable degrees of warpage on the stackable variable height via package. Further, the vias are formed with a minimum pitch.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 2:
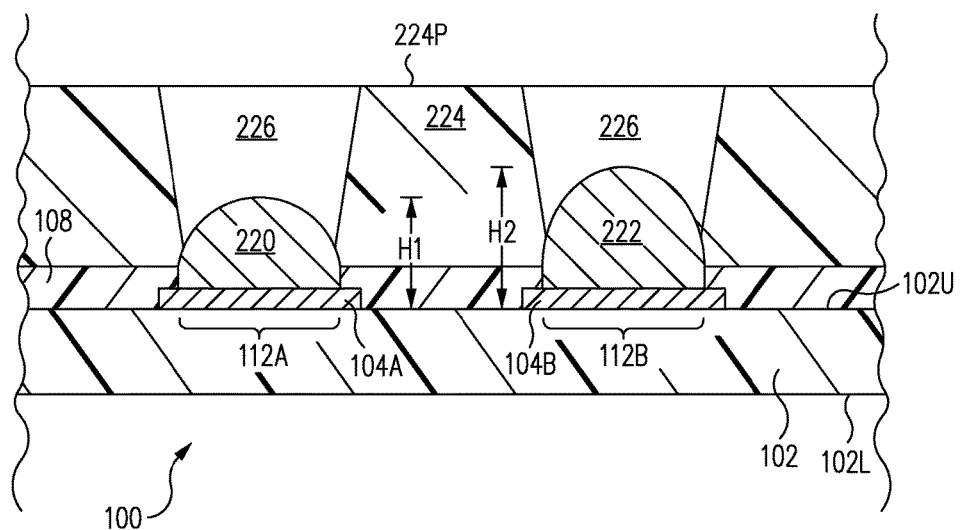
FIG. 2 is a cross-sectional view of the portion of the stackable variable height via package of FIG. 1 at a later stage during fabrication in accordance with one embodiment.
Figure 14:
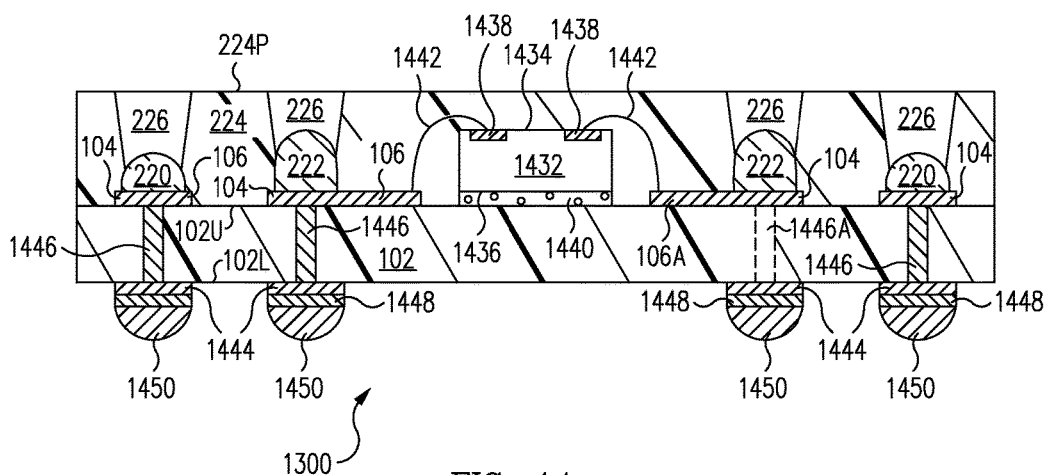
FIG. 14 is a cross-sectional view of the stackable variable height via package of FIG. 13 along the line XIV-XIV in accordance with one embodiment.

As an overview and in accordance with one embodiment, referring to FIGS. 2 and 14 together, a stackable variable height via package 1300 includes a substrate 102 having an upper surface 102U including terminals 104 formed thereon. Terminals 104 include a first terminal 104A and a second terminal 104B. Vias 220, 222 are on terminals 104, vias 220, 222 including a first via 220 on first terminal 104A and a second via 222 on second terminal 104B. Via 220 has a height H1 from upper surface 102U of substrate 102 less than a height H2 of via 222 from upper surface 102U of substrate 102. Variable height via package 1300 further includes a package body 224 and via apertures 226 in package body 224 to expose vias 220, 222.

Figure 15:
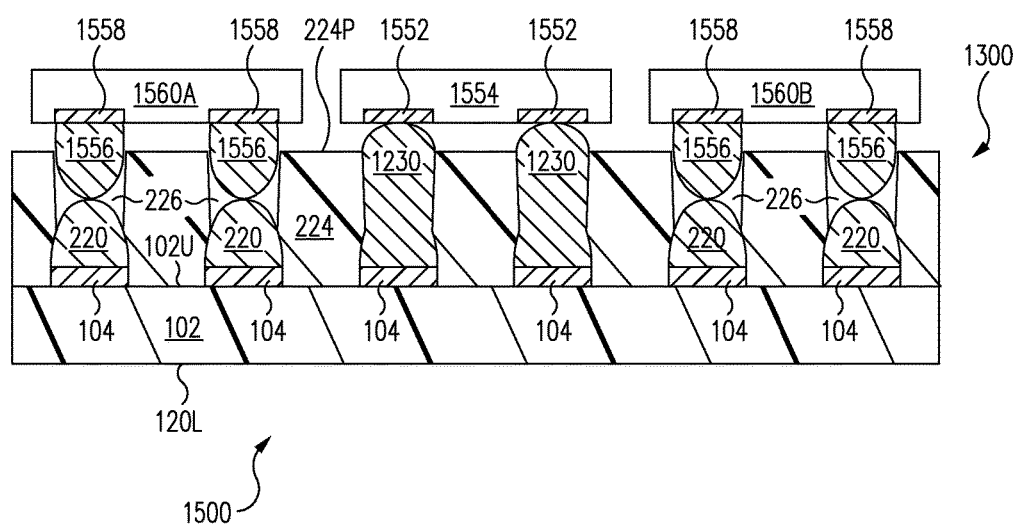
FIG. 15 is a cross-sectional view of an electronic component assembly including the stackable variable height via package of FIG. 13 along the line XV-XV during fabrication in accordance with another embodiment.
Figure 16:
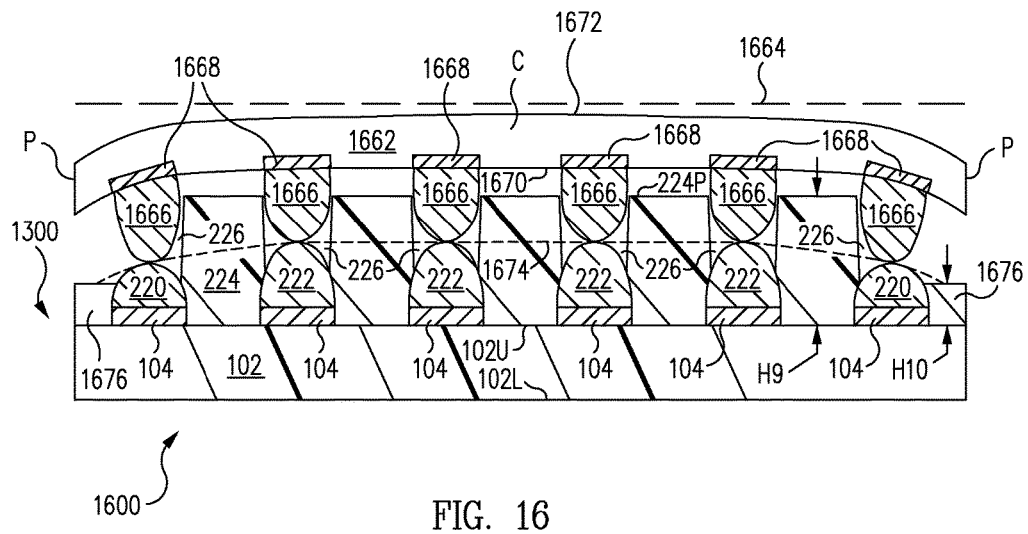
FIG. 16 is a cross-sectional view of an electronic component assembly including the stackable variable height via package of FIG. 13 along the line XV-XV during fabrication in accordance with another embodiment.
Figure 18:
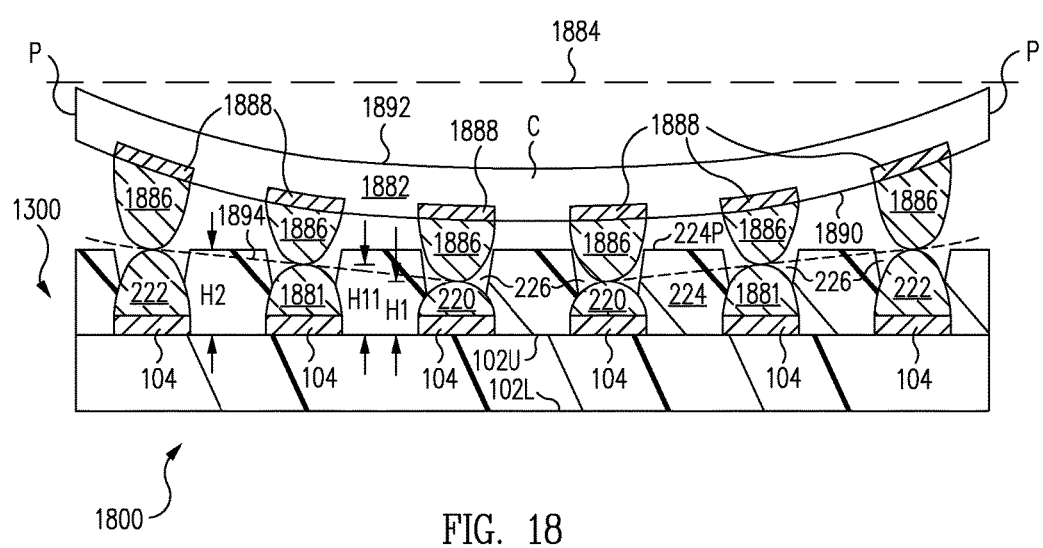
FIG. 18 is a cross-sectional view of an electronic component assembly including the stackable variable height via package of FIG. 13 along the line XV-XV during fabrication in accordance with another embodiment.

Forming stackable variable height via package 1300 with variable height vias 220, 222 readily accommodate stacking of additional packages having different types of terminals (for example, see LGA and BGA type packages 1554, 1560A, 1560B of FIG. 15), as well as variable degrees of warpage (for example, see warped electronic component packages 1662, 1882 of FIGS. 16, 18) on stackable variable height via package 1300. Further, vias 220, 222 are formed with a minimum pitch.

Figure 1:
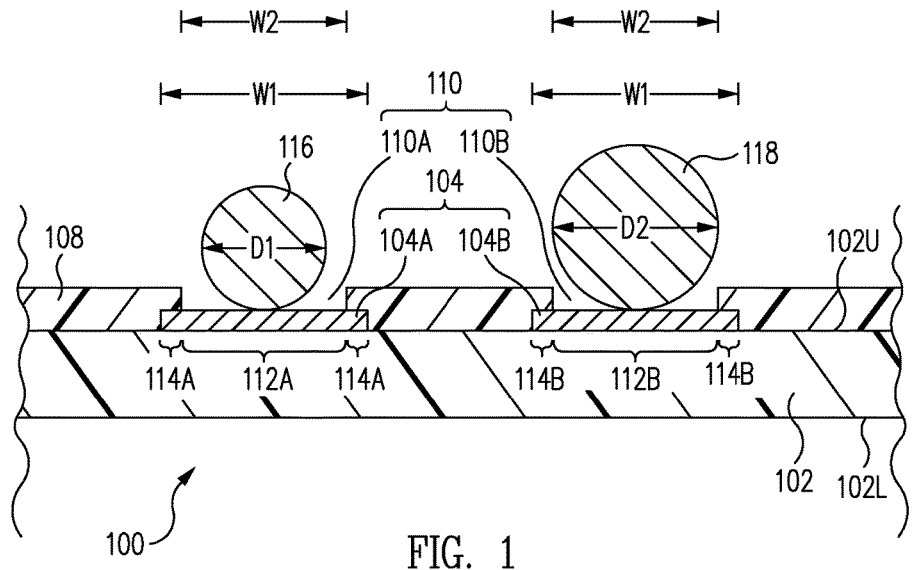
FIG. 1 is a cross-sectional view of a portion of a stackable variable height via package during fabrication in accordance with one embodiment.
Figure 1A:
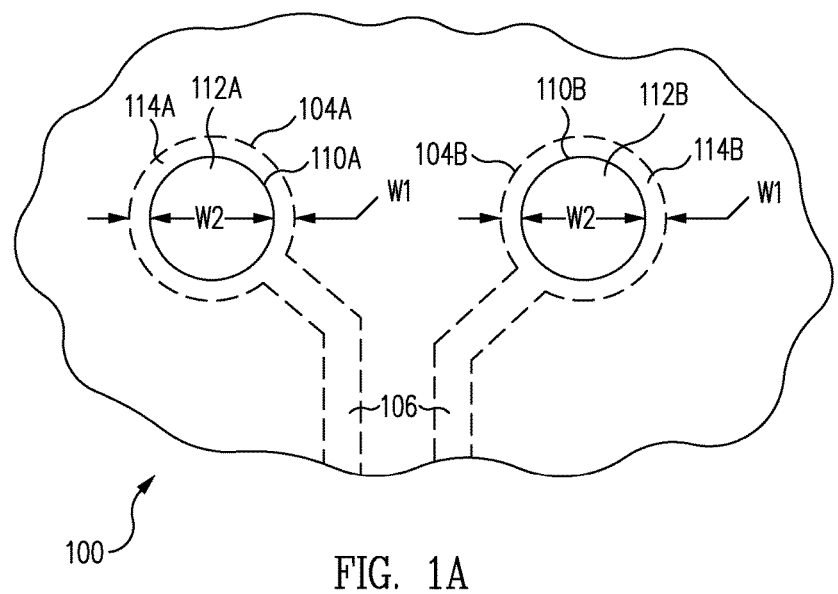
FIG. 1A is a top plan view of the portion of the stackable variable height via package of FIG. 1.

Now in more detail, FIG. 1 is a cross-sectional view of a portion of a stackable variable height via package 100 during fabrication in accordance with one embodiment. FIG. 1A is a top plan view of the portion of stackable variable height via package 100 of FIG. 1.

Referring now to FIGS. 1, 1A together, stackable variable height via package 100, sometimes called an electronic component package, includes a substrate 102 including an upper, e.g., first, surface 102U and an opposite lower, e.g., second, surface 102L. Substrate 102 is a dielectric material such as laminate, ceramic, printed circuit board material, or other dielectric material.

Formed on upper surface 102U of substrate 102 are electrically conductive upper terminals 104, e.g., formed of copper. Terminals 104 include a first terminal 104A and a second terminal 104B. Terminals 104 are electrically connected to electrically conductive upper, e.g., first, traces 106 on upper surface 102U in one embodiment.

In accordance with this embodiment, terminals 104 are essentially identical. More particularly, terminal 104A and terminal 104B have an equal width W1 in the direction parallel to upper surface 102U of substrate 102. In one embodiment, terminal 104A and terminal 104B have an equal surface area when viewed from above, i.e., from a direction perpendicular to upper surface 102U of substrate 102, as illustrated in FIG. 1A.

Although the terms parallel, perpendicular, and similar terms are used herein, it is to be understood that the described features may not be exactly parallel and perpendicular, but only substantially parallel and perpendicular to within excepted manufacturing tolerances.

Stackable variable height via package 100 further includes a solder mask 108, i.e., formed of a dielectric material. Solder mask 108 is patterned to form terminal openings 110 above respective terminals 104. In accordance with this embodiment, terminal openings 110 include a first terminal opening 110A above terminal 104A and a second terminal opening 110B above terminal 104B.

Terminal openings 110 have a width W2 less than width W1 of terminals 104. Accordingly, an exposed portion 112A of terminal 104A is exposed through terminal opening 110A and a covered portion 114A of terminal 104A is covered by solder mask 108. Similarly, an exposed portion 112B of terminal 104B is exposed through terminal opening 110B and a covered portion 114B of terminal 104B is covered by solder mask 108. Exposed portions 112A, 112B and covered portions 114A, 114B are collectively referred to as exposed portions 112 and covered portions 114 of terminals 104.

In one embodiment, exposed portions 112 are the central regions of terminals 104 and covered portions 114 are the peripheral regions of terminals 104. Illustratively, terminals 104 and terminal openings 110 are circular when viewed from above as illustrated in FIG. 1A. However, in other embodiments, terminals 104 and terminal openings 110 have non circular shapes, e.g., are rectangular, square, oval or other shape.

In accordance with this embodiment, terminals 104 have a diameter equal to width W1. Further, terminal openings 110 have a diameter equal to width W2. Terminals 104 and upper traces 106 are illustrated in dashed lines in FIG. 1A as the structures are covered by solder mask 108. Exposed portions 112 of terminals 104 are sometimes called Solder Mask Defined (SMD) lands 112. SMD lands 112 are solder wettable in accordance with this embodiment. The terms "SMD lands 112" and "exposed portions 112" are used interchangeably herein.

Referring now to FIG. 1, solder balls 116, 118 are attached to SMD lands 112, e.g., using solder flux or other technique as those of skill in the art will understand in light of this disclosure. Solder balls 116, 118 are not illustrated in the view of FIG. 1A for clarity of presentation.

In one embodiment, solder balls 116, 118 are formed of solder, i.e., are formed completely and only of solder. In another embodiment, solder balls 116, 118 are polymer core solder balls, i.e., are formed of a polymer core surrounded by solder.

Solder ball 116 has a smaller volume than solder ball 118 in accordance with this embodiment. More particularly, solder balls 116, 118 are approximate spherical. Solder ball 116 has a first diameter D1 less than a second diameter D2 of solder ball 118.

FIG. 2 is a cross-sectional view of the portion of stackable variable height via package 100 of FIG. 1 at a later stage during fabrication in accordance with one embodiment. Referring now to FIGS. 1 and 2 together, solder balls 116, 118 are reflowed to form electrically conductive vias 220, 222, respectively. More particularly, stackable variable height via package 100 is heated to melt solder balls 116, 118 which flow to cover SMD lands 112. Recall that SMD lands 112 are solder wettable. Stackable variable height via package 100 is cooled to solidify molten solder balls 116, 118 thus forming vias 220, 222, respectively.

As SMD lands 112A, 112B have an equal surface area in accordance with this embodiment, the greater volume of solder ball 118 spread over SMD land 112B causes via 222 to extend higher from upper surface 102U than via 220 formed from solder ball 116 spread over SMD land 112A. More particularly, via 220 has a height H1 from upper surface 102U of substrate 102 less than a height H2 of via 222 from upper surface 102U of substrate 102.

As discussed in greater detail below, forming stackable variable height via package 100 with variable height vias, i.e., vias 220, 222, readily accommodate stacking of additional packages having different types of terminals, e.g., land grid array (LGA) and ball grid array (BGA) type packages, as well as variable degrees of warpage on stackable variable height via package 100. Further, vias 220, 222 are formed with a minimum pitch.

Referring now to FIG. 2, a package body 224, e.g., molding compound, encapsulant, or other dielectric material, is applied to upper surface 102U of substrate 102. Package body 224 covers solder mask 108 and vias 220, 222. Package body 224 includes a principal surface 224P parallel to upper surface 102U of substrate 102.

After formation of package body 224, via apertures 226 are formed in package body 224 to expose respective vias 220, 222.

In one embodiment, via apertures 226 are formed using a laser-ablation process. More particularly, a laser is repeatedly directed at principal surface 224P perpendicularly to principal surface 224P. This laser ablates, i.e., removes, portions of package body 224 leaving via apertures 226, sometimes called through holes.

Although a laser-ablation process for formation of via apertures 226 is set forth above, in other embodiments, other via aperture formation techniques are used. For example, via apertures 226 are formed using selective molding, milling, mechanical drilling, chemical etching and/or other via aperture formation techniques.

As illustrated in FIG. 2, via apertures 226 extend between principal surface 224P of package body 224 and solder balls 116, 118. Accordingly, solder balls 116, 118 are exposed through via aperture 226.

Via apertures 226 taper from principal surface 124P to solder balls 116, 118. More particularly, the diameter of via apertures 226 in a plane parallel to principal surface 224P is greatest at the tops of via apertures 226, and smallest at the bottoms of via apertures 226 and gradually diminishes between the tops and bottoms of via apertures 226. The tops of via apertures 230 are located at principal surface 224P and the bottoms of via apertures 226 are located between principal surface 224P of package body 224 and upper surface 102U of substrate 102, i.e., at vias 220, 222, in this embodiment.

In another embodiment, via apertures 226 have a uniform diameter, i.e., have a cylindrical shape. In yet another embodiment, via apertures 226 taper from the bottoms to the tops of via aperture 226. More particularly, the diameter of via apertures 226 in a plane parallel to principal surface 224P is smallest at the tops of via apertures 226 and greatest at the bottoms of via apertures 226 and gradually increases between the tops and bottoms of via apertures 226.

Figure 3:
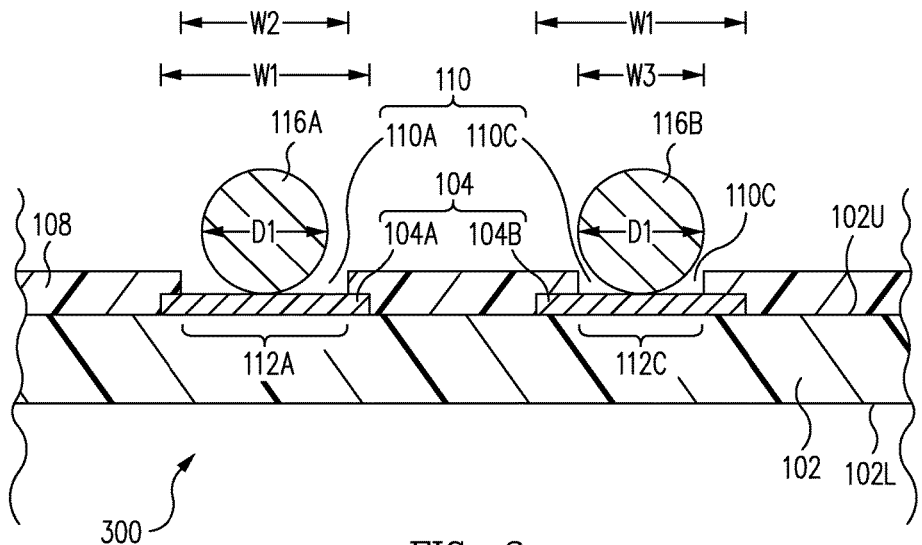
FIG. 3 is a cross-sectional view of a portion of a stackable variable height via package during fabrication in accordance with another embodiment.

FIG. 3 is a cross-sectional view of a portion of a stackable variable height via package 300 during fabrication in accordance with another embodiment. Stackable variable height via package 300 of FIG. 3 is similar to stackable variable height via package 100 of FIG. 1 and only the significant differences are discussed below.

Referring now to FIG. 3, terminal openings 110 in solder mask 108 are formed with various widths W2, W3. More particularly, terminal opening 110A has width W2 less than width W1 of terminals 104. Further, a terminal opening 110C of terminal openings 110 has a width W3 less than second width W2 of terminal opening 110A and also less than width W1 of terminals 104. Accordingly, exposed portion 112C of terminal 104B exposed through terminal opening 110C is smaller, i.e., has a smaller surface area, than exposed portion 112A of terminal 104A. Exposed portions 112A, 112C are also referred to as SMD lands 112A, 112C, respectively.

Further, solder balls 116A, 116B are attached to SMD lands 112A, 112C, i.e., exposed portions 112A, 112C of terminals 104A, 104B. In accordance with this embodiment, solder balls 116A, 116B have equal volume and are essentially identical. More particularly, solder balls 116A, 116B are approximate spherical and have first diameter D1.

Figure 4:
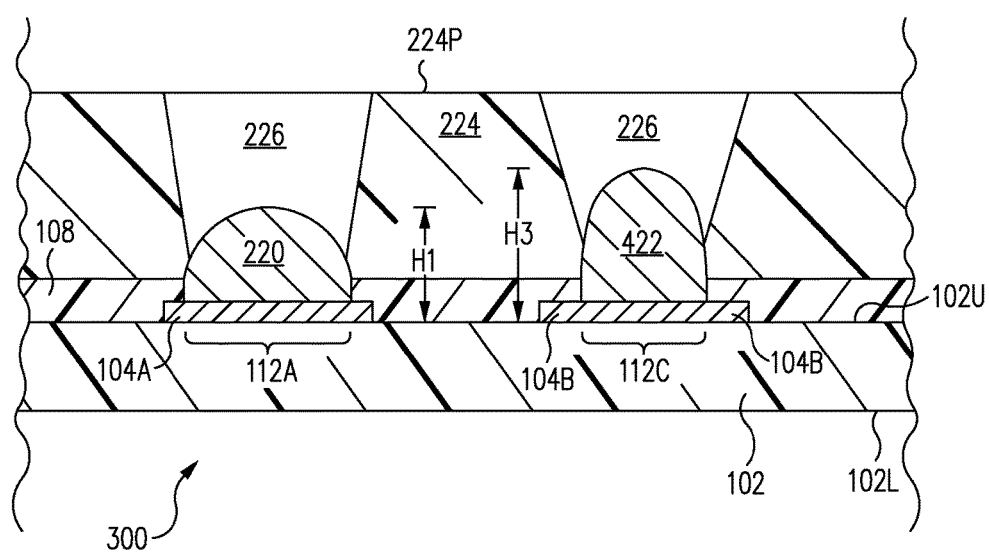
FIG. 4 is a cross-sectional view of the portion of the stackable variable height via package of FIG. 3 at a later stage during fabrication in accordance with one embodiment.

FIG. 4 is a cross-sectional view of the portion of stackable variable height via package 300 of FIG. 3 at a later stage during fabrication in accordance with one embodiment. Referring now to FIGS. 3 and 4 together, solder balls 116A, 116B are reflowed to form electrically conductive vias 220, 422 on SMD lands 112A, 112C, respectively.

More particularly, solder ball 116A is spread over SMD land 112A and solder ball 116B is spread over SMD land 112C. As SMD land 112A has a greater surface area than SMD land 112C and solder balls 116A, 116B have an equal volume in accordance with this embodiment, via 422 extends higher from upper surface 102U of substrate 102 than via 220.

More particularly, via 220 has height H1 from upper surface 102U of substrate 102 less than a height H3 of via 422 from upper surface 102U of substrate 102. As discussed in greater detail below, forming stackable variable height via package 300 with variable height vias, e.g., vias 220, 422, readily accommodates stacking of additional packages having different types of terminals, e.g., LGA and BGA type packages, as well as variable degrees of warpage on stackable variable height via package 300.

Referring now to FIG. 4, package body 224, e.g., molding compound, encapsulant, or other dielectric material, is applied to upper surface 102U of substrate 102. Package body 224 covers solder mask 108 and vias 220, 422.

After formation of package body 224, via apertures 226 are formed in package body 224 to expose respective vias 220, 422.

Figure 5A:
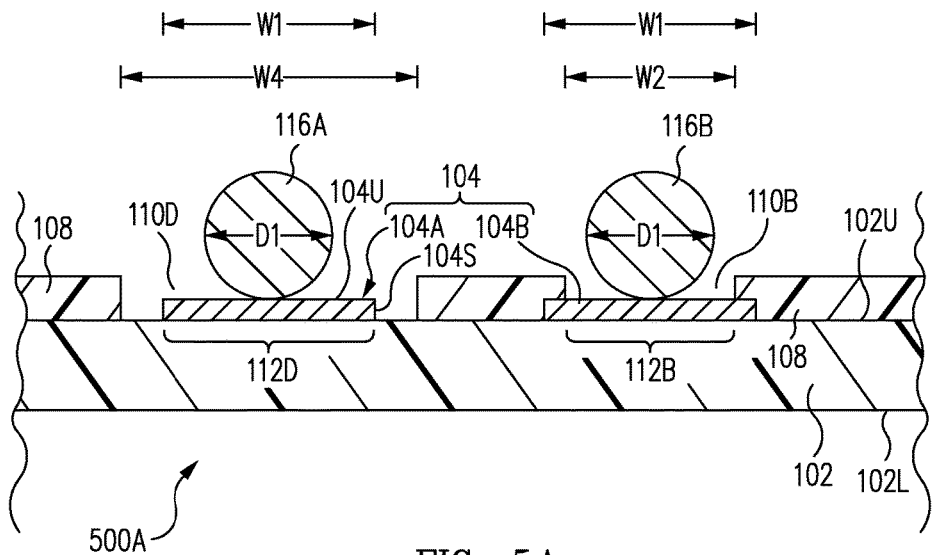
FIG. 5A is a cross-sectional view of a portion of a stackable variable height via package during fabrication in accordance with another embodiment.

FIG. 5A is a cross-sectional view of a portion of a stackable variable height via package 500A during fabrication in accordance with another embodiment. Stackable variable height via package 500A of FIG. 5A is similar to stackable variable height via package 100 of FIG. 1 and only the significant differences are discussed below.

Referring now to FIG. 5A, terminal openings 110 in solder mask 108 are formed with various widths W4, W2. More particularly, a terminal opening 110D has a width W4 greater than width W1 of terminals 104. Accordingly, terminal 104A, including the upper, e.g., first, surface 104U and sides 104S of terminal 104A, is entirely exposed through terminal opening 110D. Thus, exposed portion 112D of terminal 104A is the entire terminal 104A including upper surface 104U and sides 104S.

As upper surface 102U of substrate 102 is non-wettable with solder, terminal 104A including upper surface 104U and sides 104S defines the land. Stated another way, exposed portion 112D is upper surface 104U and sides 104S of terminal 104A. In accordance with this embodiment, exposed portion 112D is sometimes called a Non Solder Mask Defined (NSMD) land 112D.

Further, exposed portion 112B of terminal 104B exposed through terminal opening 110B is smaller, i.e., has a smaller surface area, than exposed portion 112D.

Further, solder balls 116A, 116B are attached to NSMD land 112D and SMD land 112B. In accordance with this embodiment, solder balls 116A, 116B have equal volume and are essentially identical. More particularly, solder balls 116A, 116B are approximate spherical and have first diameter D1.

Figure 6A:
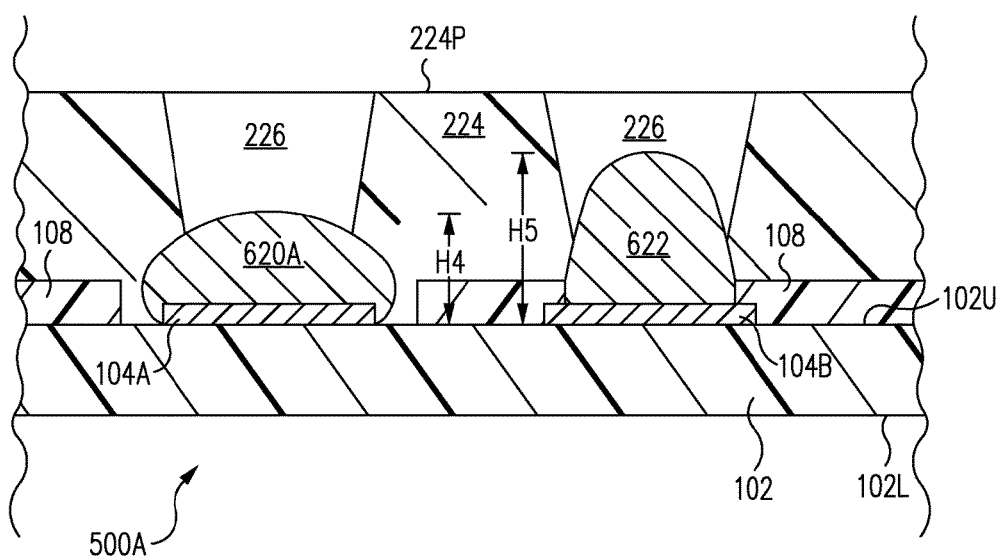
FIG. 6A is a cross-sectional view of the portion of the stackable variable height via package of FIG. 5A at a later stage during fabrication in accordance with one embodiment.

FIG. 6A is a cross-sectional view of the portion of stackable variable height via package 500A of FIG. 5A at a later stage during fabrication in accordance with one embodiment. Referring now to FIGS. 5A and 6A together, solder balls 116A, 116B are reflowed to form electrically conductive vias 620A, 622 on NSMD land 112D and SMD land 112B, respectively. As illustrated, via 620A extends around and encloses both upper surface 104U and sides 104S of terminal 104A.

More particularly, solder ball 116A is spread over NSMD land 112D including upper surface 104U and sides 104S of terminal 104A, and solder ball 116B is spread over SMD land 112B. As NSMD land 112D (upper surface 104U and sides 104S combined) has a greater surface area than SMD land 112B and solder balls 116A, 116B have equal volume in accordance with this embodiment, via 622 extends higher from upper surface 102U than via 620A. More particularly, via 620A has a height H4 from upper surface 102U of substrate 102 less than a height H5 of via 622 from upper surface 102U of substrate 102. As discussed in greater detail below, forming stackable variable height via package 500A with variable height vias, e.g., vias 620A, 622, readily accommodates stacking of additional packages having different types of terminals, e.g., LGA and BGA type packages, as well as variable degrees of warpage on stackable variable height via package 500A. Further, vias 620A, 622 are formed with minimum pitch.

Referring now to FIG. 6A, package body 224, e.g., molding compound, encapsulant, or other dielectric material, is applied to upper surface 102U of substrate 102. Package body 224 covers solder mask 108, the exposed portion of upper surface 102U, and vias 620A, 622.

After formation of package body 224, via apertures 226 are formed in package body 224 to expose respective vias 620A, 622.

Figure 5B:
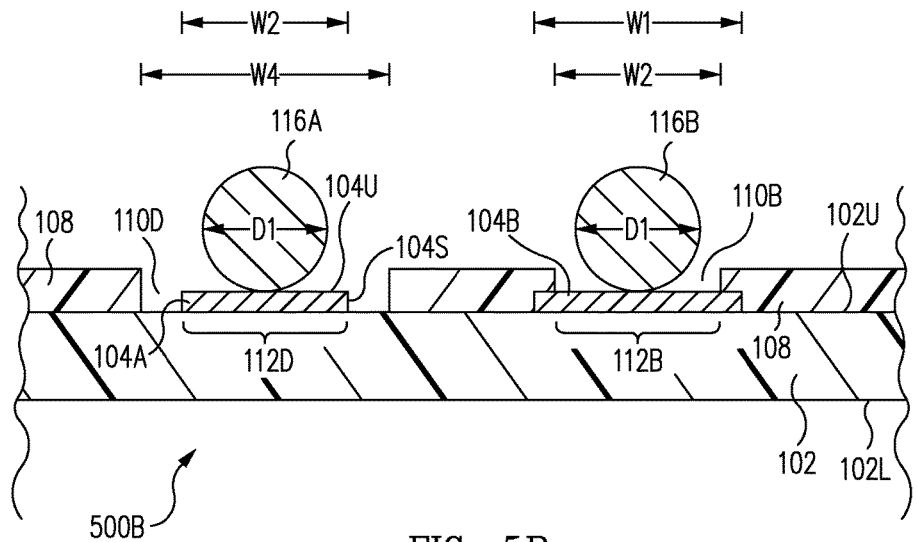
FIG. 5B is a cross-sectional view of a portion of a stackable variable height via package during fabrication in accordance with another embodiment.

FIG. 5B is a cross-sectional view of a portion of a stackable variable height via package 500B during fabrication in accordance with another embodiment. Stackable variable height via package 500B of FIG. 5B is similar to stackable variable height via package 500A of FIG. 5A and only the significant differences are discussed below.

Referring now to FIG. 5B, terminal 104A has width W2 equal to width W2 of terminal opening 110B. More particularly, terminal opening 110D has a width W4 greater than width W2 of terminal 104A. Accordingly, terminal 104A, including upper surface 104U and sides 104S of terminal 104A, is entirely exposed through terminal opening 110D. Thus, exposed portion 112D of terminal 104A is the entire terminal 104A including upper surface 104U and sides 104S.

As upper surface 102U of substrate 102 is non-wettable with solder, terminal 104A including upper surface 104U and sides 104S defines the land. Stated another way, exposed portion 112D is upper surface 104U and sides 104S of terminal 104A. In accordance with this embodiment, exposed portion 112D is sometimes called a Non Solder Mask Defined (NSMD) land 112D.

Further, upper surface 104U of terminal 104A is equal to exposed portion 112B of terminal 104B. However, considering that sides 104S of terminal 104A are also exposed, the solder wettable area of NSMD land 112D is greater than the solder wettable area of SMD land 112B.

Further, solder balls 116A, 116B are attached to NSMD land 112D and SMD land 112B. In accordance with this embodiment, solder balls 116A, 116B have equal volume and are essentially identical. More particularly, solder balls 116A, 116B are approximate spherical and have first diameter D1.

Figure 6B:
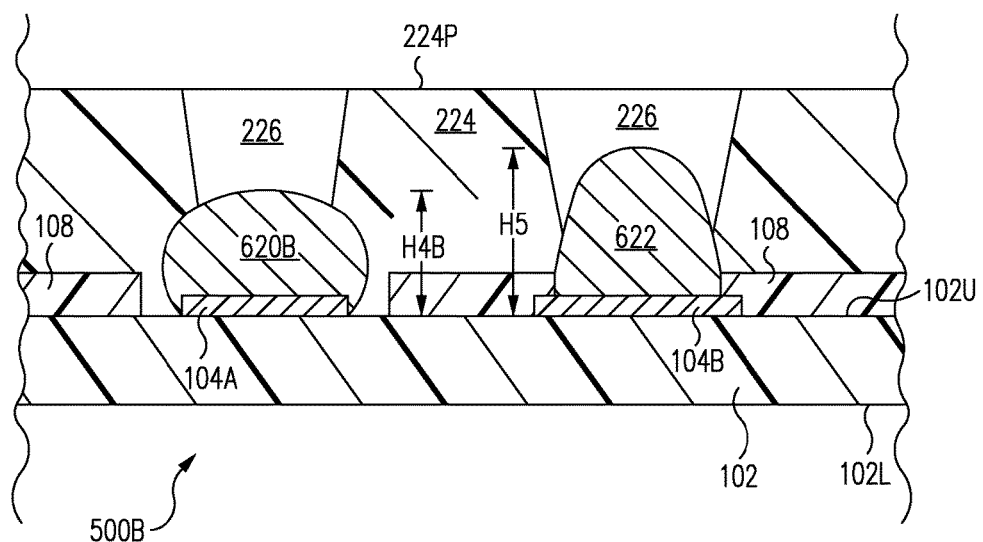
FIG. 6B is a cross-sectional view of the portion of the stackable variable height via package of FIG. 5B at a later stage during fabrication in accordance with one embodiment.

FIG. 6B is a cross-sectional view of the portion of stackable variable height via package 500B of FIG. 5B at a later stage during fabrication in accordance with one embodiment. Referring now to FIGS. 5B and 6B together, solder balls 116A, 116B are reflowed to form electrically conductive vias 620B, 622 on NSMD land 112D and SMD land 112B, respectively. As illustrated, via 620B extends around and encloses both upper surface 104U and sides 104S of terminal 104A.

More particularly, solder ball 116A is spread over NSMD land 112D including upper surface 104U and sides 104S of terminal 104A, and solder ball 116B is spread over SMD land 112B. As NSMD land 112D (upper surface 104U and sides 104S combined) has a greater surface area than SMD land 112B and solder balls 116A, 116B have equal volume in accordance with this embodiment, via 622 extends higher from upper surface 102U than via 620B. More particularly, via 620B has a height H4B from upper surface 102U of substrate 102 less than a height H5 of via 622 from upper surface 102U of substrate 102. As discussed in greater detail below, forming stackable variable height via package 500B with variable height vias, e.g., vias 620B, 622, readily accommodates stacking of additional packages having different types of terminals, e.g., LGA and BGA type packages as well as variable degrees of warpage on stackable variable height via package 500B. Further, vias 620B, 622 are formed with minimum pitch.

Referring now to FIG. 6B, package body 224, e.g., molding compound, encapsulant, or other dielectric material, is applied to upper surface 102U of substrate 102. Package body 224 covers solder mask 108, the exposed portion of upper surface 102U, and vias 620B, 622.

After formation of package body 224, via apertures 226 are formed in package body 224 to expose respective vias 620B, 622.

Figure 7:
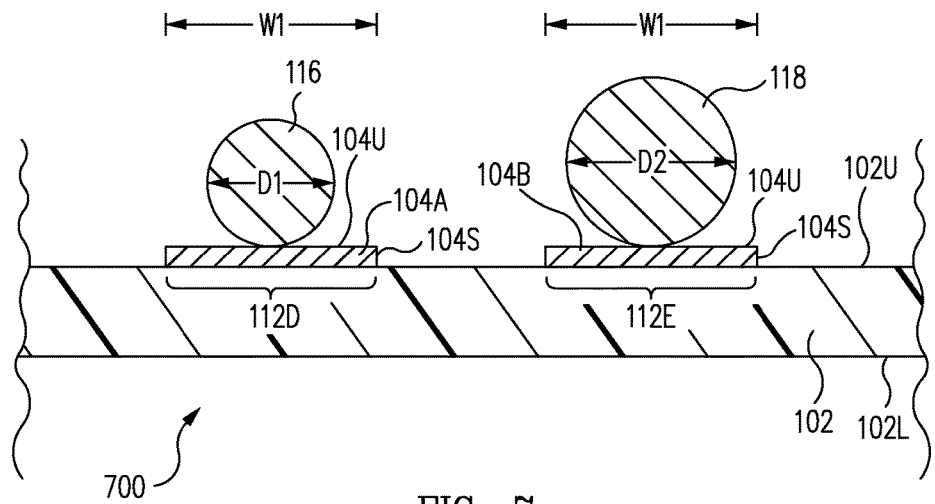
FIG. 7 is a cross-sectional view of a portion of a stackable variable height via package during fabrication in accordance with another embodiment.

FIG. 7 is a cross-sectional view of a portion of a stackable variable height via package 700 during fabrication in accordance with another embodiment. Stackable variable height via package 700 of FIG. 7 is similar to stackable variable height via package 100 of FIG. 1 and only the significant differences are discussed below.

In accordance with this embodiment, stackable variable height via package 700 is formed without solder mask 108 (see FIG. 1) or solder mask 108 is formed elsewhere on stackable variable height via package 700. Accordingly, terminals 104A, 104B including upper surfaces 104U and sides 104S are both entirely exposed. Thus, exposed portions 112D, 112E of terminals 104A, 104B are the entire terminals 104A, 104B including upper surfaces 104U and sides 104S, respectively.

As upper surface 102U of substrate 102 is non-wettable with solder, terminals 104A, 104B including upper surfaces 104U and sides 104S define the lands. Stated another way, exposed portions 112D, 112E are upper surfaces 104U and sides 104S of terminals 104A, 104B. In accordance with this embodiment, exposed portions 112D, 112E are sometimes called Non Solder Mask Defined (NSMD) lands 112D, 112E, respectively. Both NSMD lands 112D, 112E have an equal width W1 and thus have an equal surface area.

Further, solder balls 116, 118 are attached to NSMD lands 112D, 112E. Solder ball 116 has a smaller volume than solder ball 118 in accordance with this embodiment. More particularly, solder balls 116, 118 are approximate spherical. Solder ball 116 has first diameter D1 less than second diameter D2 of solder ball 118.

Figure 8:
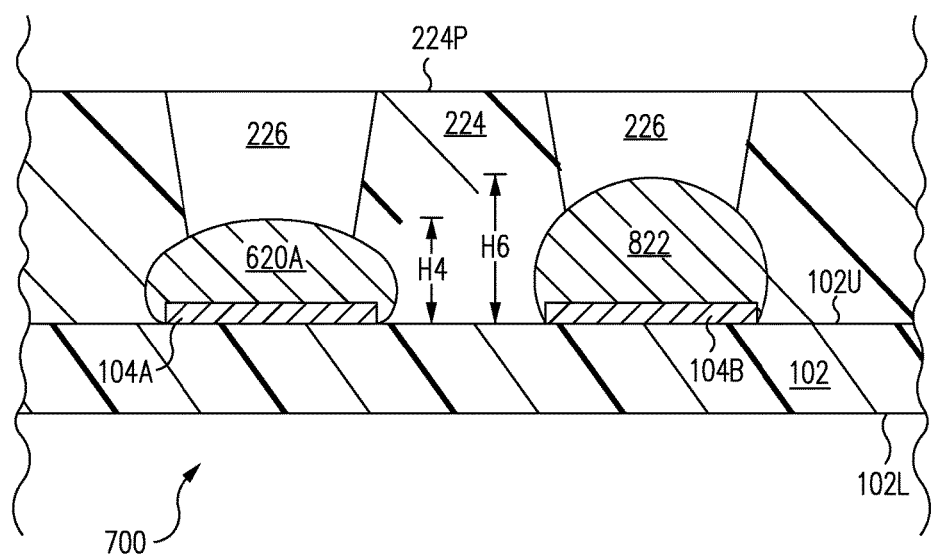
FIG. 8 is a cross-sectional view of the portion of the stackable variable height via package of FIG. 7 at a later stage during fabrication in accordance with one embodiment.

FIG. 8 is a cross-sectional view of the portion of stackable variable height via package 700 of FIG. 7 at a later stage during fabrication in accordance with one embodiment. Referring now to FIGS. 7 and 8 together, solder balls 116, 118 are reflowed to form electrically conductive vias 620A, 822, respectively. As illustrated, vias 620A, 822 extend around and enclose upper surfaces 104U and sides 104S of terminals 104A, 104B.

As NSMD lands 112D, 112E have an equal surface area in accordance with this embodiment, the greater volume of solder ball 118 spread over NSMD land 112E causes via 822 to extend higher from upper surface 102U than via 620A formed from solder ball 116 spread over NSMD land 112D. More particularly, via 620A has height H4 from upper surface 102U of substrate 102 less than a height H6 of via 822 from upper surface 102U of substrate 102. As discussed in greater detail below, forming stackable variable height via package 700 with variable height vias, e.g., vias 620A, 822, readily accommodate stacking of additional packages having different types of terminals, e.g., LGA and BGA type packages, as well as variable degrees of warpage on stackable variable height via package 700. Further, vias 620A, 822 are formed with a minimum pitch.

Referring now to FIG. 8, package body 224, e.g., molding compound, encapsulant, or other dielectric material, is applied to upper surface 102U of substrate 102. Package body 224 covers upper surface 102U of substrate 102 and vias 620A, 822.

After formation of package body 224, via apertures 226 are formed in package body 224 to expose respective vias 620A, 822.

Figure 9:
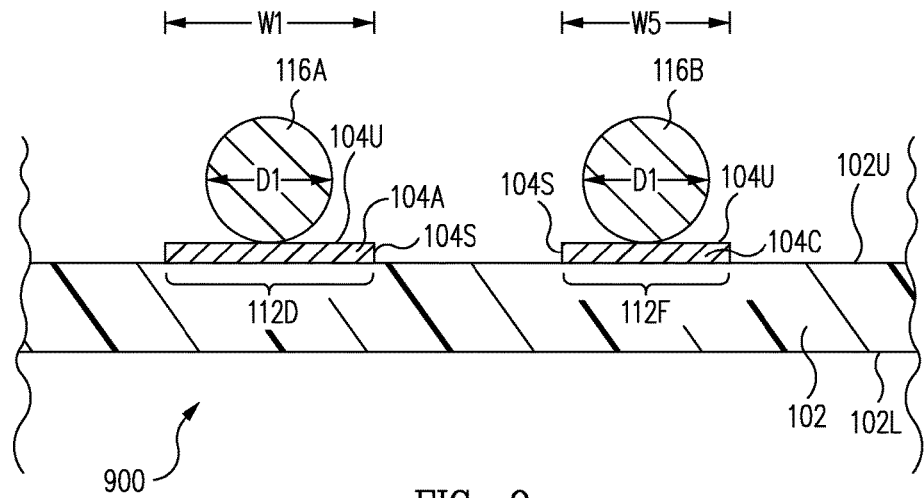
FIG. 9 is a cross-sectional view of a portion of a stackable variable height via package during fabrication in accordance with another embodiment.

FIG. 9 is a cross-sectional view of a portion of a stackable variable height via package 900 during fabrication in accordance with another embodiment. Stackable variable height via package 900 of FIG. 9 is similar to stackable variable height via package 100 of FIG. 1 and only the significant differences are discussed below.

In accordance with this embodiment, stackable variable height via package 900 is formed without solder mask 108 (see FIG. 1) or solder mask 108 is formed elsewhere on stackable variable height via package 900. Accordingly, terminals 104A, 104C including upper surfaces 104U and sides 104S of terminals 104A, 104C are both entirely exposed. Thus, exposed portions 112D, 112F of terminals 104A, 104C are the entire terminals 104A, 104C including upper surfaces 104U and sides 104S, respectively.

As upper surface 102U of substrate 102 is non-wettable with solder, terminals 104A, 104C including upper surfaces 104U and sides 104S define the lands. Stated another way, exposed portions 112D, 112F are upper surfaces 104U and sides 104S of terminals 104A, 104C. In accordance with this embodiment, exposed portions 112D, 112F are sometimes called Non Solder Mask Defined (NSMD) lands 112D, 112F, respectively.

NSMD lands 112D, 112F, i.e., terminals 104A, 104C, are formed with various widths W1, W5. More particularly, NSMD land 112F has width W5 less than width W1 of NSMD land 112D. Accordingly, NSMD land 112F is smaller, i.e., has a smaller surface area, than NSMD land 112D.

Further, solder balls 116A, 116B are attached to NSMD lands 112D, 112F, respectively. In accordance with this embodiment, solder balls 116A, 116B have equal volume and are essentially identical. More particularly, solder balls 116A, 116B are approximate spherical and have first diameter D1.

Figure 10:
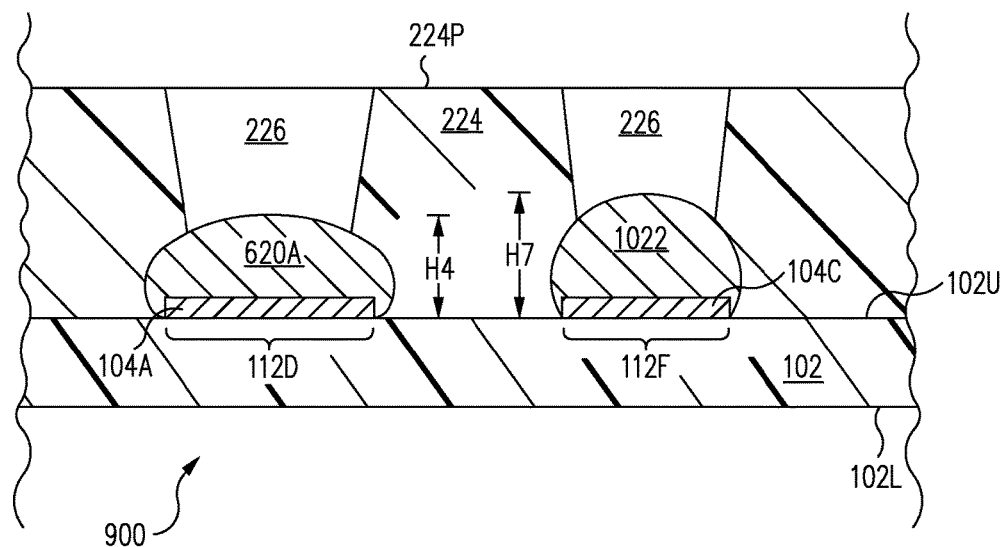
FIG. 10 is a cross-sectional view of the portion of the stackable variable height via package of FIG. 9 at a later stage during fabrication in accordance with one embodiment.

FIG. 10 is a cross-sectional view of the portion of stackable variable height via package 900 of FIG. 9 at a later stage during fabrication in accordance with one embodiment. Referring now to FIGS. 9 and 10 together, solder balls 116A, 116B are reflowed to form electrically conductive vias 620A, 1022 on NSMD lands 112D, 112F, respectively. As illustrated, vias 620A, 1022 extend around and enclose upper surfaces 104U and sides 104S of terminals 104A, 104C.

More particularly, solder ball 116A is spread over NSMD land 112D and solder ball 116B is spread over NSMD land 112F. As NSMD land 112D has a greater surface area than NSMD land 112F and solder balls 116A, 116B have equal volume in accordance with this embodiment, via 1022 extends higher from upper surface 102U than via 620A. More particularly, via 620A has height H4 from upper surface 102U of substrate 102 less than a height H7 of via 1022 from upper surface 102U of substrate 102. As discussed in greater detail below, forming stackable variable height via package 900 with variable height vias, e.g., vias 620A, 1022, readily accommodates stacking of additional packages having different types of terminals, e.g., LGA and BGA type packages, as well as variable degrees of warpage on stackable variable height via package 900.

Referring now to FIG. 10, package body 224, e.g., molding compound, encapsulant, or other dielectric material, is applied to upper surface 102U of substrate 102. Package body 224 covers upper surface 102U of substrate 102 and vias 620A, 1022.

After formation of package body 224, via apertures 226 are formed in package body 224 to expose respective vias 620A, 1022.

Figure 11:
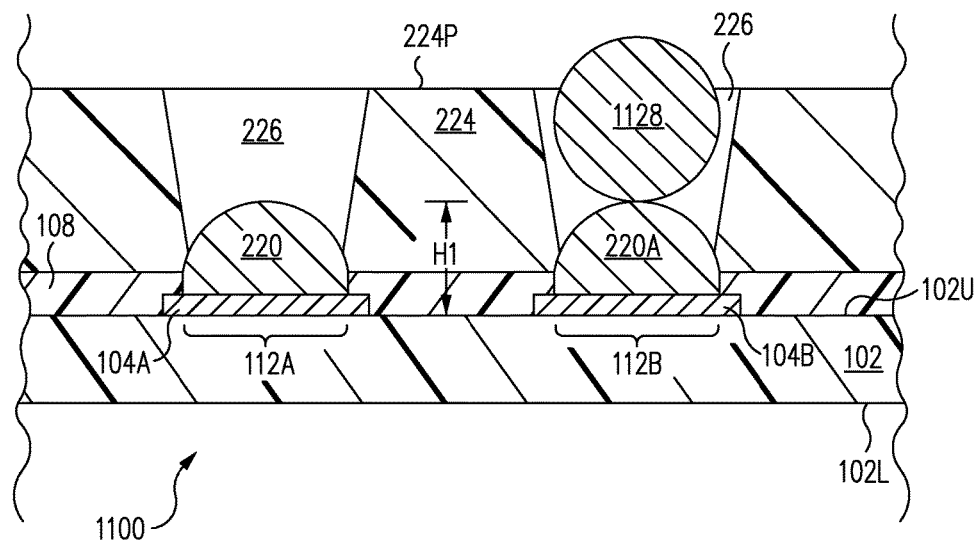
FIG. 11 is a cross-sectional view of a portion of a stackable variable height via package during fabrication in accordance with yet another embodiment.

FIG. 11 is a cross-sectional view of a portion of a stackable variable height via package 1100 during fabrication in accordance with yet another embodiment. Stackable variable height via package 1100 of FIG. 11 is similar to stackable variable height via package 100 of FIG. 2 and only the significant differences are discussed below.

In accordance with this embodiment, vias 220, 220A formed on SMD lands 112A, 112B are identical and have a same height H1 from upper surface 102U of substrate 102. For example, instead of having different volume solder balls 116, 118 as illustrated in FIG. 1, two identical solder balls 116 are reflowed to form vias 220, 220A on SMD lands 112A, 112B.

Referring now to FIG. 11, to buildup via 220A, a buildup solder ball 1128 is placed into via aperture 226 and on via 220A. Note a buildup solder ball is not placed in via aperture 226 and on via 220. Although a buildup solder ball 1128 is illustrated and discussed herein, in other embodiments, solder paste is placed into via aperture 226 and on via 220A.

Figure 12:
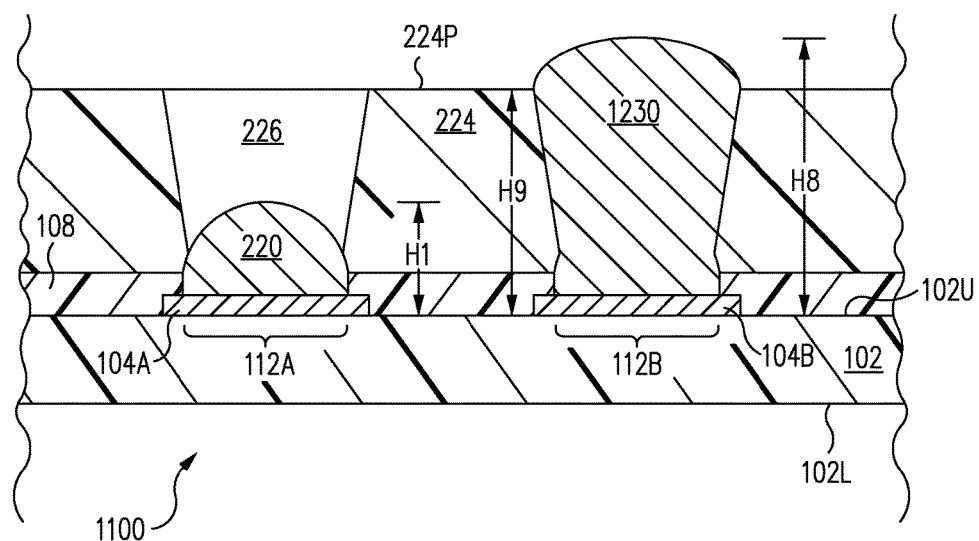
FIG. 12 is a cross-sectional view of the portion of the stackable variable height via package of FIG. 11 at a later stage during fabrication in accordance with one embodiment.

FIG. 12 is a cross-sectional view of the portion of stackable variable height via package 1100 of FIG. 11 at a later stage during fabrication in accordance with one embodiment. Referring now to FIGS. 11 and 12 together, stackable variable height via package 1100 is heated to reflow via 220A and buildup solder ball 1128 creating a protruding via 1230. More particularly, via 220A and buildup solder ball 1128 are heated to a melt, combine together into a single molten structure, and solidify upon cooling to form protruding via 1230.

Protruding via 1230 extends higher from upper surface 102U than via 220. More particularly, protruding via 1230 has a height H8 from upper surface 102U of substrate 102 greater than height H1 of via 220 from upper surface 102U of substrate 102. As discussed in greater detail below, forming stackable variable height via package 1100 with variable height vias, e.g., vias 220, 1230, readily accommodates stacking of additional packages having different types of terminals, e.g., LGA and BGA type packages, as well as variable degrees of warpage on stackable variable height via package 1100. Further, vias 220, 1230 are formed with a minimum pitch.

Further, height H8 of protruding via 1230 is also greater than a height H9 of principal surface 224P of package body 224 from upper surface 102U of substrate 102. Accordingly, protruding via 1230 protrudes outward beyond (above) principal surface 224P of package body 224. In contrast, height H1 of via 220 is less than height H9 of principal surface 224P such that via 220 is recessed below principal surface 224P.

Although buildup of via 220A is discussed in relation to FIGS. 11, 12, in other embodiments, any of vias 220, 222 (FIG. 2), 422 (FIG. 4), 620A, 622 (FIG. 6A), 620B (FIG. 6B), 822 (FIG. 8), 1022 (FIG. 10) are built up by reflowing a buildup solder ball 1128 (FIG. 11) to form a protruding via similar to protruding via 1230.

Further, although stackable variable height via packages 100, 300, 500A, 500B, 700, 900, 1100 are discuss and illustrated as including vias 220, 222 (FIG. 2), 220, 422 (FIG. 4), 620A, 622 (FIG. 6A), 620B, 622 (FIG. 6B), 620A, 822 (FIG. 8), 620A, 1022 (FIG. 10), 220, 1230 (FIG. 12), in light of this disclosure, those of skill in the art will understand that a stackable variable height via package in accordance with various embodiments is fabricated with one or more of vias 220, 222, 422, 620A, 620B, 622, 822, 1022, 1230, and/or combinations thereof.

Figure 13:
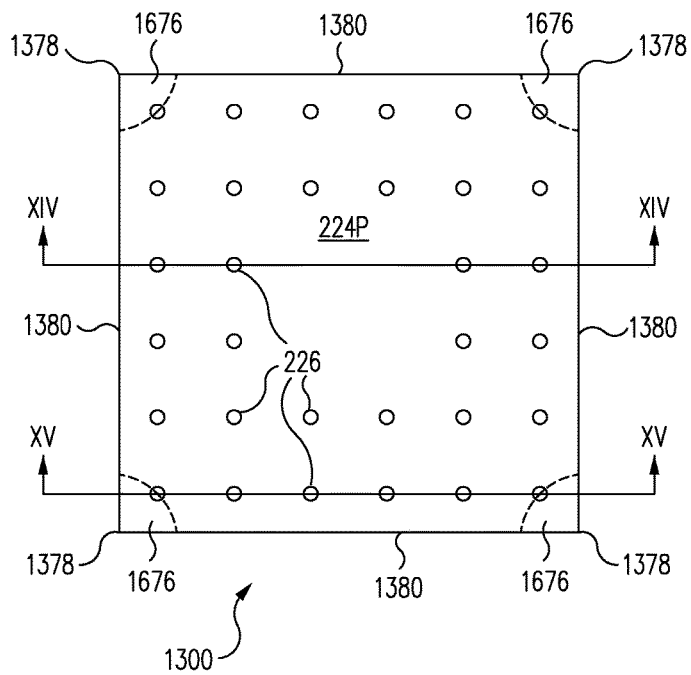
FIG. 13 is a top plan view of a stackable variable height via package in accordance with another embodiment.

FIG. 13 is a top plan view of a stackable variable height via package 1300 in accordance with another embodiment. FIG. 14 is a cross-sectional view of stackable variable height via package 1300 of FIG. 13 along the line XIV-XIV in accordance with one embodiment.

Referring now to FIGS. 13 and 14 together, stackable variable height via package 1300 includes an electronic component 1432. In one embodiment, electronic component 1432 is an integrated circuit chip, e.g., an active component. However, in other embodiments, electronic component 1432 is a passive component such as a capacitor, resistor, or inductor.

In accordance with this embodiment, electronic component 1432 includes an active surface 1434 and an opposite inactive surface 1436. Electronic component 1432 further includes bond pads 1438 formed on active surface 1434. Inactive surface 1436 is mounted to upper surface 102U of substrate 102 with an adhesive 1440, sometimes called a die attach adhesive.

Figure 19:
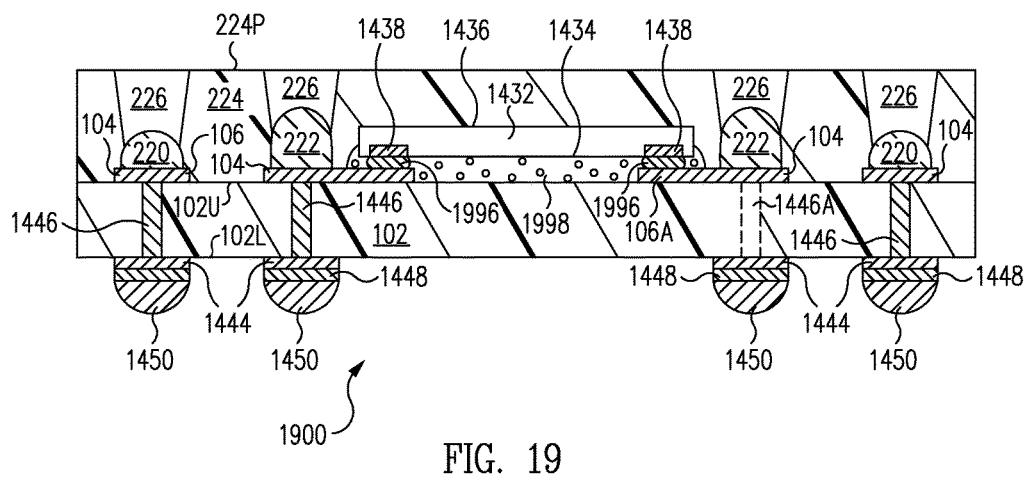
FIG. 19 is a cross-sectional view of a stackable variable height via package in accordance with another embodiment.

Although electronic component 1432 is illustrated and described as being mounted to upper surface 102U of substrate 102 in a wirebond configuration, in other embodiments, electronic component 1432 is mounted to upper surface 102U of substrate 102 in a different configuration such as a flip chip configuration such as that illustrated in FIG. 19. In another embodiment, a plurality of electronic components are mounted to upper surface 102U of substrate 102, e.g., in a stacked configuration, such as that illustrated in FIG. 20.

Formed on upper surface 102U of substrate 102 are electrically conductive upper, e.g., first, traces 106, e.g., formed of copper. Bond pads 1438 are electrically connected to upper traces 106, e.g., bond fingers thereof, by electrically conductive bond wires 1442.

Formed on lower surface 102L of substrate 102 are lower, e.g., second, traces 1444. Lower traces 1444 are electrically connected to upper traces 106 by electrically conductive substrate vias 1446 extending through substrate 102 between upper surface 102U and lower surface 102L.

Formed on lower traces 1444 are pads 1448, e.g., lands. Formed on pads 1448 are interconnection balls 1450, e.g., solder balls in a BGA format. Although not illustrated in FIG. 14, in a manner similar to that discussed above, stackable variable height via package 1300 further includes solder masks on upper and lower surface 102U, 102L that protect first portions of upper and lower traces 106, 1444 while exposing second portions, e.g., terminals and/or bond fingers, of upper and lower traces 106, 1444.

Although a particular electrically conductive pathway between bond pads 1438 and interconnection balls 1450 is described above, other electrically conductive pathways can be formed. For example, contact metallizations can be formed between the various electrical conductors.

Further, instead of straight though substrate vias 1446, in one embodiment, substrate 102 is a multilayer substrate and a plurality of substrate vias and/or internal traces form the electrical interconnection between upper traces 106 and lower traces 1444.

In accordance with one embodiment, one or more of upper traces 106 is not electrically connected to lower traces 1444, i.e., is electrically isolated from lower traces 1444, and electrically connected to bond pads 1438. To illustrate, a first upper trace 106A of the plurality of upper traces 106 is electrically isolated from lower traces 1444 and electrically connected to a respective bond pad 1438. In accordance with this embodiment, the respective bond pad 1438 electrically connected to upper trace 106A is also electrically isolated from lower traces 1444.

In accordance with one embodiment, one or more of upper traces 106 is electrically connected to both bond pads 1438 and to lower traces 1444. To illustrate, instead of being electrically isolated from lower traces 1444, upper trace 106A is electrically connected to lower traces 1444 by a substrate via 1446A of the plurality of substrate vias 1446. In accordance with this embodiment, the respective bond pad 1438 is electrically connected to upper trace 106A and is also electrically connected to lower traces 1444.

Substrate via 1446A is indicated by dashed lines to signify that formation of substrate via 1446A is optional. If substrate via 1446A is not formed, upper trace 106A is electrically isolated from lower traces 1444. Conversely, if substrate via 1446A is formed, upper trace 106A is electrically connected to lower traces 1444.

In accordance with one embodiment, one or more of upper traces 106 is not electrically connected to a bond pad 1438, i.e., is electrically isolated from bond pads 1438, and is electrically connected to lower traces 1444. To illustrate, the upper trace 106 to the far left of electronic component 1432 in the view of FIG. 14 is electrically isolated from bond pads 1438 and electrically connected to lower traces 1444. In accordance with this embodiment, the respective lower traces 1444 electrically connected to the upper trace 106 electrically isolated from bond pads 1438 are also electrically isolated from bond pads 1438.

Although various examples of connections between bond pads 1438, upper traces 106, and lower traces 1444 are set forth above, in light of this disclosure, those of skill in the art will understand that any one of a number of electrical configurations are possible depending upon the particular application.

Upper traces 106 are electrically connected to terminals 104 on upper surface 102U of substrate 102. Variable height vias 220, 222 are formed on terminals 104. Although stackable variable height via package 1300 is discuss and illustrated as including vias 220, 222, in light of this disclosure, those of skill in the art will understand that a stackable variable height via package in accordance with various embodiments is fabricated with one or more of vias 220, 222, 422, 620A, 620B, 622, 822, 1022, 1230, and/or combinations thereof as described above.

As set forth above, in accordance with various embodiments, upper traces 106 are electrically connected to lower traces 1444, to bond pads 1438, and/or to lower traces 1444 and bond pads 1438. Thus, in accordance with various embodiments, vias 220, 222 are electrically connected to lower traces 1444 only, to bond pads 1438 only, and/or to both lower traces 1444 and bond pads 1438.

Electronic component 1432, bond wires 1442, vias 220, 222, and the exposed portions of upper surface 102U including upper traces 106 are enclosed, sometimes called encased, encapsulated, and/or covered, with package body 224. Illustratively, package body 224 is a cured liquid encapsulant, molding compound, or other dielectric material. Package body 224 protects electronic component 1432, bond wires 1442, vias 220, 222, and the exposed portions of upper surface 102U including upper traces 106 from the ambient environment, e.g., from contact, moisture and/or shorting to other structures.

To form stackable variable height via package 1300 as illustrated in FIGS. 13, 14, inactive surface 1436 of electronic component 1432 is mounted to upper surface 102U of substrate 102 by adhesive 1440. Bond pads 1438 are electrically connected to upper traces 106 by bond wires 1442. Vias 220, 222 are formed on terminals 104 as described above. Electronic component 1432, bond wires 1442, vias 220, 222 and the exposed portions of upper surface 102U including upper traces 106 are enclosed within package body 224. Via apertures 226 are formed in package body 224 to expose vias 220, 222 as discussed above.

FIG. 15 is a cross-sectional view of an electronic component assembly 1500 including stackable variable height via package 1300 of FIG. 13 along the line XV-XV during fabrication in accordance with another embodiment. Referring now to FIG. 15, stackable variable height via package 1300 includes protruding vias 1230 protruding above principal surface 224P of package body 224 and vias 220.

Terminals 1552 of a Land Grid Array (LGA) electronic component package 1554 are place on and in contract with protruding vias 1230. Further, interconnection balls 1556 on terminals 1558 of Ball Grid Array (BGA) electronic component packages 1560A, 1560B are placed inside of via apertures 226 on and in contract with vias 220.

Electronic component assembly 1500 is then heated to reflow vias 220, 1230 and interconnection balls 1556 thus mounting LGA electronic component package 1554 and BGA electronic component packages 1560A, 1560B to stackable variable height via package 1300 as those of skill in the art will understand in light of this disclosure.

Forming stackable variable height via package 1300 with variable height vias, e.g., vias 220, 1230, readily accommodate stacking of additional packages 1554, 1560A, 1560B having LGA and BGA types of terminals. Further, vias 220, 1230 are formed with a minimum pitch.

FIG. 16 is a cross-sectional view of an electronic component assembly 1600 including stackable variable height via package 1300 of FIG. 13 along the line XV-XV during fabrication in accordance with another embodiment. Referring now to FIG. 16, stackable variable height via package 1300 includes vias 220, 222 in accordance with this embodiment.

Electronic component assembly 1600 further includes a warped Ball Grid Array (BGA) package 1662 containing an electronic component. Warped BGA package 1662 is warped, i.e., is not completely planar. Warped BGA package 1662 is sometimes called bent, curved, and/or non-planar. More particularly, warped BGA package 1662 is bent from a hypothetical plane 1664 indicated by the dashed line. Typically, it is desirable to form a package without warpage, however, some warpage often occurs depending upon the manufacturing process used to fabricate the electronic component package.

Warped BGA package 1662 includes interconnection balls 1666 on terminals 1668 on a terminal, e.g., first, surface 1670 of warped BGA package 1662. Warped BGA package 1662 further includes a second surface 1672 opposite terminal surface 1670.

In accordance with this embodiment, warped BGA package 1662 is bent in the concave direction relative to terminal surface 1670. Stated another way, warped BGA package 1662 is concavely warped. Accordingly, the periphery P of terminal surface 1670, and in particularly the corners, are bent inward (downward in the view of FIG. 16) relative to the center C of terminal surface 1670. Thus, interconnection balls 1666 line upon a concave curve 1674 instead of lying upon a plane.

Vias 220, 222 accommodate the curvature of interconnection ball 1666 thus insuring formation of reliable interconnections therewith. In accordance with this embodiment, vias 220 are formed adjacent to periphery P, and in particular, at the corners. In contrast, vias 222, which have a greater height than vias 220, are formed adjacent to center C. Although vias 220, 222, i.e., two different height vias, are set forth, in light of this disclosure, those of skill in the art will understand that a plurality of different height vias are formed to accommodate the particular warpage of the package being mounted on stackable variable height via package 1300 in accordance with other embodiments.

Referring still to the example illustrated in FIGS. 13, 16, interconnection balls 1666 are placed inside of via apertures 226 on and in contract with vias 220, 222. To prevent the corners of warped BGA package 1662 from contacting package body 224, in one embodiment, package body 224 includes shortened corners 1676. Shortened corners 1676 are formed at the corners 1378 (see FIG. 13) of stackable variable height via package 1300. Corners 1378 are defined at the intersections of sides 1380 of stackable variable height via package 1300. Shortened corners 1676 are indicated by the dashed lines in FIG. 13 to indicate that shortened corners 1676 are optional.

Shortened corners 1676 have a height H10 from upper surface 102U of substrate 102 less than height H9 of principal surface 224P of package body 224 from upper surface 102U of substrate 102. In one embodiment, shortened corners 1676 are formed by removal of package body 224 at corners 1378. In other embodiments, shortened corners 1676 are formed using selective molding, or other techniques.

By forming stackable variable height via package 1300 with shortened corners 1676, clearance is provided for the corners of warped BGA package 1662. The corners of warped BGA package 1662 typically have the greatest inward offset (warpage) of warped BGA package 1662. Accordingly, inadvertent and undesirable contact between the corners of warped BGA package 1662 and package body 224 is prevented thus insuring formation of reliable interconnections with warped BGA package 1662.

Figure 17:
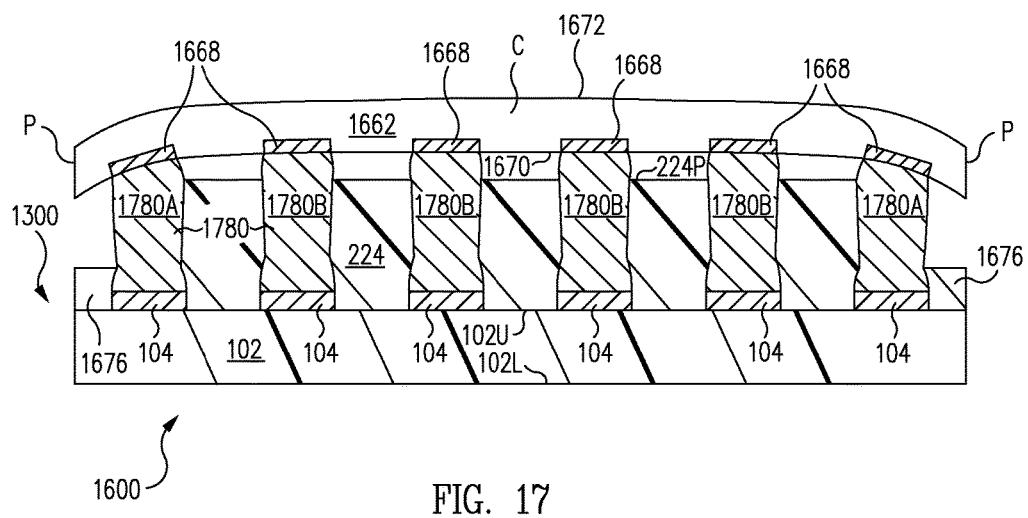
FIG. 17 is a cross-sectional view of the electronic component assembly of FIG. 16 at a later stage during fabrication in accordance with one embodiment.

FIG. 17 is a cross-sectional view of electronic component assembly 1600 of FIG. 16 at a later stage during fabrication in accordance with one embodiment. Referring now to FIGS. 16 and 17 together, interconnection balls 1666 are placed in contact with vias 220, 222 as illustrated in FIG. 16. Assembly 1600 is heated to reflow interconnection balls 1666 and vias 220, 222 forming solder columns 1780 as illustrated in FIG. 17.

More particularly, interconnection balls 1666 and vias 220, 222, e.g., solder, are heated to melt interconnection balls 1666 and vias 220, 222. Upon melting, interconnection balls 1666 and vias 220, 222 combine into a single molten structures, e.g., molten solder. These molten structures cool and form solder columns 1780. In accordance with this embodiment, solder columns 1780 are integral, i.e., are single unitary structures and not a plurality of different layers connected together.

Solder columns 1780 physically and electrically connect terminals 104 of stackable variable height via package 1300 with terminals 1668 of warped BGA package 1662. Solder columns 1780 are formed with variable height to accommodate the warpage of warped BGA package 1662. More particularly, solder columns 1780A of the plurality of solder columns 1780 are formed adjacent to periphery P, and in particular, at the corners. In contrast, solder columns 1780B of the plurality of solder columns 1780, which have a greater height than solder columns 1780A, are formed adjacent to center C.

FIG. 18 is a cross-sectional view of an electronic component assembly 1800 including stackable variable height via package 1300 of FIG. 13 along the line XV-XV during fabrication in accordance with another embodiment. Referring now to FIG. 18, stackable variable height via package 1300 includes three different height vias 220, 222, 1881 in accordance with this embodiment. Height H1 of vias 220 is less than height H11 of vias 1881, which is less than height H2 of vias 222, from upper surface 102U of substrate 102. Vias 1881 are formed using any one of the variable height via formation techniques discussed above in reference to FIGS. 1-12.

Electronic component assembly 1800 further includes a warped Ball Grid Array (BGA) package 1882. Warped BGA package 1882 is warped, i.e., is not completely planar. Warped BGA package 1882 is sometimes called bent, curved, and/or non-planar. More particularly, warped BGA package 1882 is bent from a hypothetical plane 1884.

Warped BGA package 1882 includes interconnection balls 1886 on terminals 1888 on a terminal, e.g., first, surface 1890 of warped BGA package 1882. Warped BGA package 1882 further includes a second surface 1892 opposite terminal surface 1890.

In accordance with this embodiment, warped BGA package 1882 is bent in the convex direction relative to terminal surface 1890. Stated another way, warped BGA package 1882 is convexly warped. Accordingly, the periphery P of terminal surface 1890, and in particularly the corners, are bent outward (upward in the view of FIG. 18) relative to the center C of terminal surface 1890. Thus, interconnection balls 1886 line upon a convex curve 1894 instead of line upon a plane.

Vias 220, 1881, 222 accommodate the curvature of interconnection ball 1886 thus insuring formation of reliable interconnections therewith. In accordance with this embodiment, vias 222 are formed adjacent to periphery P, and in particular, at the corners. In contrast, vias 220, which have a lesser height than vias 222, are formed adjacent to center C. Vias 1881, which have a height between vias 222 and vias 220, are formed between vias 222 and vias 220.

In one embodiment, vias 222 are formed at the corners, vias 1881 are formed adjacent vias 222 only, and the remaining vias are vias 220. Although vias 220, 1881, 222, i.e., three different height vias, are set forth, in light of this disclosure, those of skill in the art will understand that a plurality of different height vias are formed to accommodate the particular warpage of the package being mounted on stackable variable height via package 1300 in accordance with other embodiments.

Referring still to the example illustrated in FIGS. 13, 18, interconnection balls 1886 are placed inside of via apertures 226 on and in contract with vias 220, 1881, 222. Assembly 1800 is heated to reflow interconnection balls 1886 and vias 220, 1881, 222 forming solder columns in a manner similar to that illustrated in FIG. 17, except that taller solder columns are formed adjacent periphery P of terminal surface 1890, and in particularly the corners, relative to the solder columns formed at center C of terminal surface 1890.

FIG. 19 is a cross-sectional view of a stackable variable height via package 1900 in accordance with another embodiment. Stackable variable height via package 1900 of FIG. 19 is similar to stackable variable height via package 1300 of FIG. 14 and only the significant differences between stackable variable height via package 1900 and stackable variable height via package 1300 are discussed below.

Referring now to FIG. 19, in accordance with this embodiment, electronic component 1432 is mounted in a flip chip configuration. More particularly, bond pads 1438 are electrically and physically connected to upper traces 106, e.g., bond fingers thereof, by flip chip bumps 1996, e.g., solder bumps. Optionally, an underfill 1998 is applied between upper surface 102U of substrate 102 and active surface 1434 of electronic component 1432 and around flip chip bumps 1996.

Figure 20:
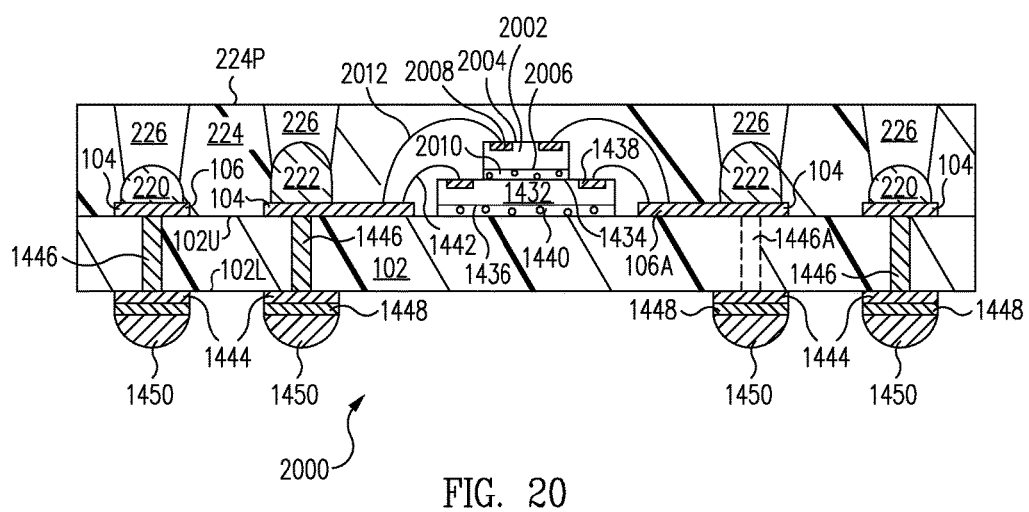
FIG. 20 is a cross-sectional view of a stackable variable height via package in accordance with yet another embodiment.

FIG. 20 is a cross-sectional view of a stackable variable height via package 2000 in accordance with yet another embodiment. Stackable variable height via package 2000 of FIG. 20 is similar to stackable variable height via package 1300 of FIG. 14 and only the significant differences between stackable variable height via package 2000 and stackable variable height via package 1300 are discussed below.

Referring now to FIG. 20, in accordance with this embodiment, a second electronic component 2002 is mounted to electronic component 1432, sometimes called a first electronic component, in a stacked configuration. In one embodiment, second electronic component 2002 is an integrated circuit chip, e.g., an active component. However, in other embodiments, second electronic component 2002 is a passive component such as a capacitor, resistor, or inductor.

In accordance with this embodiment, second electronic component 2002 includes an active surface 2004 and an opposite inactive surface 2006. Second electronic component 2002 further includes bond pads 2008 formed on active surface 2004. Inactive surface 2006 is mounted to active surface 1434 of first electronic component 1432 with an adhesive 2010. Bond pads 2008 are electrically connected to upper traces 106, e.g., bond fingers thereof, by electrically conductive bond wires 2012. Package body 224 further encapsulates second electronic component 2002 including bond wires 2012.

Although one example of a stacked configuration is illustrated in FIG. 20, in light of this disclosure, those of skill in the art will understand that other stacked configurations are used in other stackable variable height via packages in other embodiments.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of fabricating a stackable variable height via package, the method comprising:
   placing solder balls on terminals on a first surface of a substrate, the terminals comprising a first terminal and a second terminal;
   reflowing the solder balls to form vias on the terminals, the vias comprising a first via on the first terminal and a second via on the second terminal, the first via having a height from the first surface of the substrate less than a height of the second via from the first surface of the substrate;
   mounting an integrated circuit chip to the first surface of the substrate and positioned directly between the first via and the second via, wherein said mounting comprises mounting an inactive surface of the integrated circuit chip to the first surface of the substrate with an adhesive;
   electrically connecting first traces on the first surface of the substrate to bond pads on an active surface of the integrated circuit chip with bond wires, the first traces being electrically connected to the terminals;
   after said reflowing, forming a package body comprising an encapsulating material that encloses lateral and top sides of the vias, wherein the encapsulating material is a single continuous molded material that further encloses at least lateral and top sides of the integrated circuit chip and at least lateral and top sides of the bond wires; and
   forming via apertures in at least the encapsulating material to expose the vias.

2. The method of claim 1, wherein the solder balls comprise polymer core solder balls.

3. The method of claim 1, wherein said forming via apertures comprises ablating the via apertures in the encapsulating material.

4. The method of claim 3, wherein, after the package body is formed, the substrate is planar.

5. The method of claim 3, wherein said forming via apertures comprises forming the via apertures in the encapsulating material after said forming the package body.

6. The method of claim 3, wherein the substrate further comprises:
   second traces on a second surface of the substrate; and
   substrate vias electrically connecting the first traces with the second traces.

7. The method of claim 6, further comprising connecting interconnection balls to the second traces, the interconnection balls for mounting the stackable variable height via package to another substrate, wherein while the substrate is planar and while the first via has the height from the first surface of the substrate that is less than the height of the second via from the first surface of the substrate, the interconnection balls are all the same height from the second surface of the substrate.

8. The method of claim 1, further comprising forming a solder mask, different from the encapsulating material, on the first surface of the substrate, the solder mask having terminal openings formed therein, wherein exposed portions of the terminals are exposed through the terminal openings, the exposed portions defining Solder Mask Defined (SMD) lands, and wherein covered portions of the terminals are contacted and covered by the solder mask.

9. The method of claim 8, wherein the SMD lands comprise a first SMD land and a second SMD land, the first SMD land comprising an exposed portion of the first terminal exposed through a first terminal opening of the terminal openings, the second SMD land comprising an exposed portion of the second terminal exposed through a second terminal opening of the terminal openings, wherein a surface area of the first SMD land is equal to a surface area of the second SMD land.

10. The method of claim 8, wherein the SMD lands comprise a first SMD land and a second SMD land, the first SMD land comprising only an exposed portion of a top side of the first terminal exposed through a first terminal opening of the terminal openings, the second SMD land comprising only an exposed portion of a top side of the second terminal exposed through a second terminal opening of the terminal openings, wherein a surface area of the first SMD land is greater than a surface area of the second SMD land.

11. A method of fabricating a stackable variable height via package, the method comprising:
   providing a substrate comprising:
      a first surface;
      a first terminal coupled to the first surface of the substrate;
      a second terminal coupled to the first surface of the substrate;
      a solder mask coupled to the first surface of the substrate;
      a first terminal opening in the solder mask that exposes an exposed portion of the first terminal to form a first Solder Mask Defined (SMD) land comprising only a portion of a top side of the first terminal; and
      a second terminal opening in the solder mask that exposes an exposed portion of the second terminal to form a second SMD land comprising only a portion of a top side of the second terminal,
      wherein a surface area of the first SMD land is greater than a surface area of the second SMD land;
   reflowing solder to form a first via coupled to the first terminal and a second via coupled to the second terminal, the first via having a height from the first surface of the substrate less than a height of the second via from the first surface of the substrate; and
   after said providing and said reflowing:
      forming a package body comprising an encapsulating material that encloses lateral and top sides of the first and second vias; and
      forming apertures in at least the encapsulating material to expose the first and second vias, said forming apertures comprising laser ablating the apertures in the encapsulating material.

12. The method of claim 11, further comprising mounting an integrated circuit chip to the first surface of the substrate and positioned directly between the first via and the second via, wherein the encapsulating material is a single continuous molded material that further encloses at least lateral and top sides of the integrated circuit chip.

13. The method of claim 12, wherein the first via and the second via each comprise a same solder volume.

14. A method of fabricating a stackable variable height via package, the method comprising:
providing a substrate comprising:
a first surface;
a first terminal at the first surface of the substrate;
a second terminal at the first surface of the substrate; and
a plurality of traces at the first surface of the substrate;
reflowing a first solder ball to form a first via coupled to the first terminal;
reflowing a second solder ball to form a second via coupled to the second terminal, the first via having a height from the first surface of the substrate less than a height of the second via from the first surface of the substrate;
mounting an integrated circuit chip to the first surface of the substrate and positioned directly between the first via and the second via, said mounting comprising electrically connecting each of the plurality of first traces to a respective conductive pad on an active surface of the integrated circuit chip;
after said reflowing the first and second solder balls, forming a package body comprising an encapsulating material that encloses lateral and top sides of the first and second vias; and
after forming the package body comprising the encapsulating material, forming apertures in the encapsulating material, by at least in part removing first and second portions of the encapsulating material, to expose the first and second vias, respectively.

15. The method of claim 14, further comprising forming a plurality of interconnection balls on a second surface of the substrate, where the interconnection balls are all the same height from the second surface of the substrate after said forming the package body.

16. The method of claim 11, wherein after said forming apertures, the encapsulating material directly contacts and laterally surrounds the first and second vias.

17. The method of claim 11, wherein no portion of the first via is directly vertically above the solder mask.

18. The method of claim 11, wherein, after the package body is formed, the substrate is planar.

19. The method of claim 11, wherein the substrate comprises:
a first trace on a second surface of the substrate;
a second trace on the second surface of the substrate;
a first substrate via electrically connecting the first terminal with the first trace; and
a second substrate via electrically connecting the second terminal with the second trace.

20. The method of claim 19, comprising forming interconnection balls on the first and second traces, the interconnection balls for mounting the stackable variable height via package to another substrate, wherein while the substrate is planar and while the first via has the height from the first surface of the substrate that is less than the height of the second via from the first surface of the substrate, the interconnection balls are all the same height from the second surface of the substrate.

* * * * *